United States Patent
Lin et al.

(10) Patent No.: US 6,178,549 B1
(45) Date of Patent: Jan. 23, 2001

(54) MEMORY WRITER WITH DEFLECTIVE MEMORY-CELL HANDLING CAPABILITY

(75) Inventors: Shi-Tron Lin, Taipei; Meng-Tsang Wu, HsinChu, both of (TW)

(73) Assignee: Winbond Electronics Corporation (TW)

(*) Notice: Under 35 U.S.C. 154(b), the term of this patent shall be extended for 0 days.

(21) Appl. No.: 09/041,483

(22) Filed: Mar. 12, 1998

(51) Int. Cl.[7] ............................................. G06F 9/445
(52) U.S. Cl. ..................... 717/4; 717/2; 717/3; 717/5; 717/11; 714/8
(58) Field of Search ................. 717/11, 2, 3, 4, 717/5; 714/8

(56) References Cited

U.S. PATENT DOCUMENTS

| | | | |
|---|---|---|---|
| 5,668,815 | * | 9/1997 | Gittinger et al. ............... 714/719 |
| 5,764,574 | * | 6/1998 | Nevill et al. ................... 365/200 |
| 5,781,717 | * | 7/1998 | Wu et al. ........................... 714/8 |
| 5,795,797 | * | 8/1998 | Chester et al. .................... 438/4 |
| 5,841,709 | * | 11/1998 | McClure ......................... 365/200 |
| 5,935,258 | * | 8/1999 | Klein ............................... 714/8 |
| 5,958,065 | * | 9/1999 | Klein ............................... 714/8 |
| 5,958,068 | * | 9/1999 | Arimilli et al. ................... 714/8 |
| 5,974,564 | * | 10/1999 | Jeddeloh ........................... 714/8 |
| 6,005,813 | * | 12/1999 | Waller et al. ................... 365/200 |
| 6,032,264 | * | 2/2000 | Beffa et al. ...................... 714/7 |
| 6,055,204 | * | 4/2000 | Bosshart .................... 365/230.06 |
| 6,098,194 | * | 8/2000 | Rinne et al. ...................... 714/8 |

OTHER PUBLICATIONS

Youngs et al., "Mapping and Repairing Embedded-Memory", IEEE, pp. 18–24, Mar. 1997*

Lin et al., "Testing Content-Addressable Memories Using Functional Fault Models and March-Like Algorithms", IEEE, pp. 577–588, May 2000.*

IBM Technical Disclosure Bulletin, "Redundant Memory Cell and Decoder", vol. 13, No. 7, pp. 1924–1926, Dec. 1970.*

IBM Technical Disclosure Bulletin, "Row by Row Dynamic Image Analysis of Matrix of Scanned Points", vol. 25, No. 5, pp. 2521–2536, Oct. 1982.*

IBM Technical Disclosure Bulletin, "Detect Skip Algorithm", vol. 29, No. 6, pp. 2736–2737, Nov. 1986.*

IBM Technical Disclosure Bulletin, "Microprocessor With a Selectable PLA Bypass", vol. 28, No. 11, pp. 4870–4871, Apr. 1986.*

* cited by examiner

*Primary Examiner*—Tariq R. Hafiz
*Assistant Examiner*—Ted T. Vo
(74) *Attorney, Agent, or Firm*—Fulbright & Jaworski L.L.P.

(57) ABSTRACT

A memory writer has the capability to modify the machine code according to the defective memory-cell locations, such that the modified code functionally bypasses all defective memory-cell addresses upon program execution. The machine code is modified without re-compilation of the microprogram, instead, it is modified by inserting jump machine-code instructions directly between instruction steps, and to insert dummy bytes between adjacent memory space allocations for symbols definition. The machine code is further modified to take into account of the effect of the insertion of additional codes on the instruction within the machine code that involve the address referencing. The modified machine code, when written to the partially defective memory, performs identical routines while bypassing all defective memory-cell addresses. The present invention is useful for writing a microprogram in non-volatile memories, such as EPROM, EEPROM or Flash/EEPROM. It is also useful in loading a microprogram in volatile memories like SRAM, DRAM, etc.

30 Claims, 4 Drawing Sheets

MEMORY WRITER WITH DEFLECTIVE MEMORY-CELL HANDLING CAPABILITY

FIELD OF INVENTION

The present invention relates to a method and system for modifying a microprogram-code before writing it into a partially defective memory.

BACKGROUND OF THE INVENTION

In the past, memory chips with defective cells will not be sold in the marketplace. However, with the advent of a number of state-of-art techniques, defective memory chip can behave as a defective-free memory chip. And there are a number of patents addressing methods of using partially defective memories as transparently "good" memories. It is also well known that defective memory-cells can be located by any appropriate testing procedure, such as alternatively writing "1" and "0" in each bit location and then verifying the results.

U.S. Pat. No. 4,939,694 to Eaton et. al., describes a self-testing and self-repairing memory system. The memory system tests itself during field use to locate defective memory-cells. Once these defective memory-cells are located, the memory system uses the error correction code engine to correct these defective memory-cells. When the error correction code engine becomes overburdened, then the memory system replaces these defective memory-cells.

U.S. Pat. No. 5,644,541, to Siu et. al., describes a memory system comprising a plurality of semiconductor memories with some bad bits, a substitution memory and a mapping logic to redirect accesses to bad-bit locations in the semiconductor memories to good storage cells within the substitution memory.

U.S. Pat. No. 5,278,847, to Helbig, Sr. and Anastasia, describes a fault-tolerating memory system that uses an error-detecting-and-correcting (EDAC) code. The reliability of storage is greatly improved by extension of each word to add EDAC encoding and spare-bit portions, as well as by extension of depth to allow spare words to be present, along with high-reliability storage of word maps.

U.S. Pat. No. 5,579,266 to Tahara, handles defective memory by use of laser repair, or programmable fuse repair, and replaces defective memory-cells with redundant rows and columns.

Executable machine code are typically generated from the source code of a computer program by the compile and link operations. As the executable machine code is obtained, it is ready to be loaded into memories for program execution.

It is observed that, the error checking and error correcting techniques, or memory re-direct techniques, provided by some of the prior arts inevitably adds overhead to the hardware design and/or program execution each time the executable machine code is executed. On the other hand, the redundant memories, circuits and the defective memory repair work provided by some prior arts also add design and operation complications.

BRIEF DESCRIPTION OF THE APPENDED DRAWINGS

FIG. 1 discloses the general concept of the present invention.

DETAILED DESCRIPTIONS OF THE PREFERRED EMBODIMENT

Figure 1:
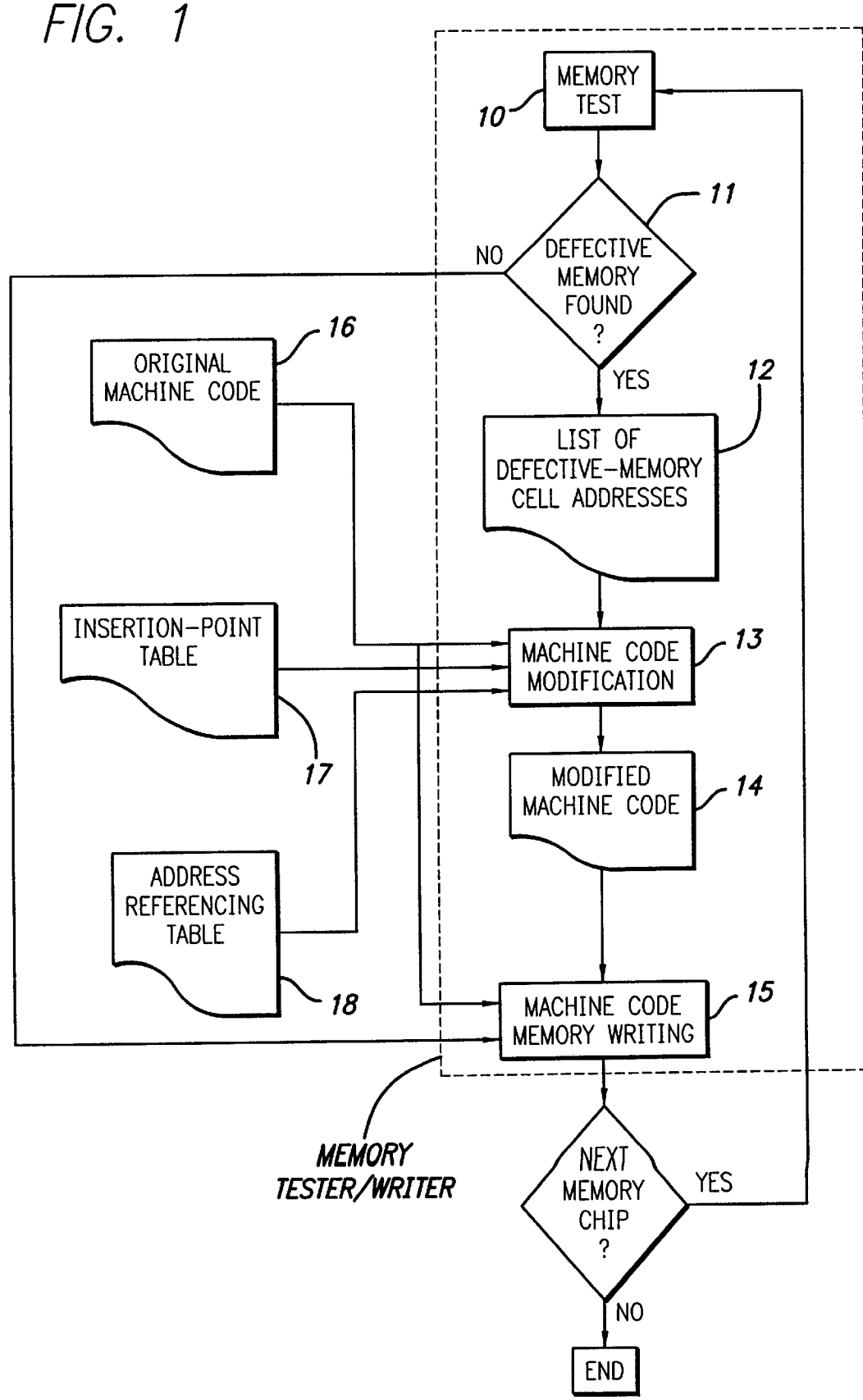

The present invention relates to a method of directly modifying the machine code according to the defective memory locations, such that when the executable machine code are written into the memory, the defective memory-cell locations are functionally bypassed. The invention is most useful and efficient in a write-once, execute-many-times, microprogram applications.

The present invention also relates to a system, built upon a code-modifying engine, for automatically modifying the machine code according to the defective memory-cell locations and according to a particular programming language instruction sets (e.g., 80×86 instruction sets), such that the modified machine code performs the identical functions and routines while functionally bypassing the defective memory-cells.

Before implementing the invention, other than the original machine code, the insertion-point table and the address referencing table are obtained first by any method including operator's judgment. Table 1 an example of a machine code with its corresponding machine code address and the corresponding assembly instructions.

The insertion-point table is an assembly of the machine code addresses at which additional code can be inserted without changing the functionality of the instruction steps of the original computer program. The acceptable insertion-point include the beginning of a machine-code instruction step, or the beginning of the byte position allocated for the definition of a symbol in the data segment, or the beginning of a stack allocation in the stack segment. The table 4 shows an example of a complete insertion-point table for the machine code shown in Table 1. In this example, an insertion point can be at the beginning of a data declaration (insertion type=1) or the beginning of an instruction step (insertion type=2). Alternatively, an insertion point table may include only a subset of those insertion points shown in the Table 4.

In machine-code programming, the relative address technique is frequently used. Other than the relative address technique, the absolute address technique is also used in address referencing in micro-programming. The address referencing table is an assembly of the machine code addresses at which an address is referred either by the relative address technique or the absolute address technique. Each entry in the table includes information regarding the number of bytes of contents corresponding to that address, the machine-code address referred to in the instruction and the type of the address referencing. Table 3 shows the address referencing table corresponding to the machine code shown in Table 1. When the machine code is available, a disassembly process is performed first by the operator to obtain its assembly form. From assembly language instruction, the insertion-point table and the address-referencing table may be obtained straightforward. There are a number of instructions typically involve address-referencing, for example, jump related instructions like JMP, JZ, JNZ; loop related instructions like LOOP; subroutine-calling related instructions like CALL, etc.

The general concept of the present invention is illustrated in FIG. 1. In FIG. 1, it shows a procedure by which a memory tester tests a memory chip for obtaining the defective memory-cell locations, modifies the machine code according to the list of defective memory-cell locations, and then writes the modified machine code into the memory. In block 10, memory test by any well known method is performed. If defective memory-cells are found in block 11, in block 12, an address list of the defective memory-cells is obtained. In block 13, based on the address list from block 12 and the original machine code from block 16, the insertion-point table from block 17, and the address-referencing table from block 18, a routine of the present invention directly modifies the machine code. The modified machine code, shown in block 14, will functionally bypass defective memory-cell addresses upon program execution. Afterwards, in block 15, the modified machines code are written into the memory. On the other hand, if no defective memory-cell is found in block 11, then the present invention directly writes the original machine code, from the block 16, into the memory in the block 15.

Figure 2:
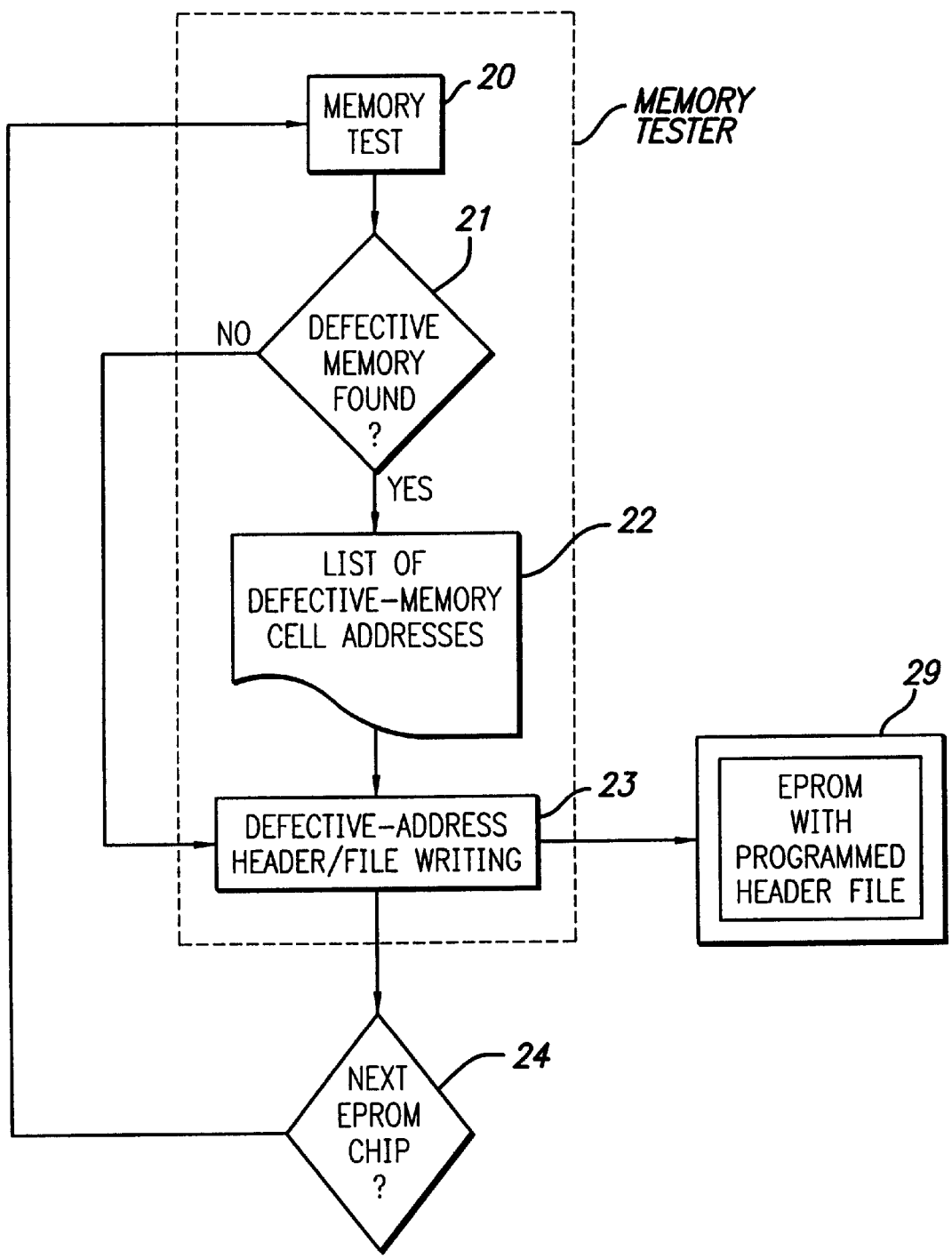
FIG. 2 shows the processes performed by a memory tester according to the invention.
Figure 3:
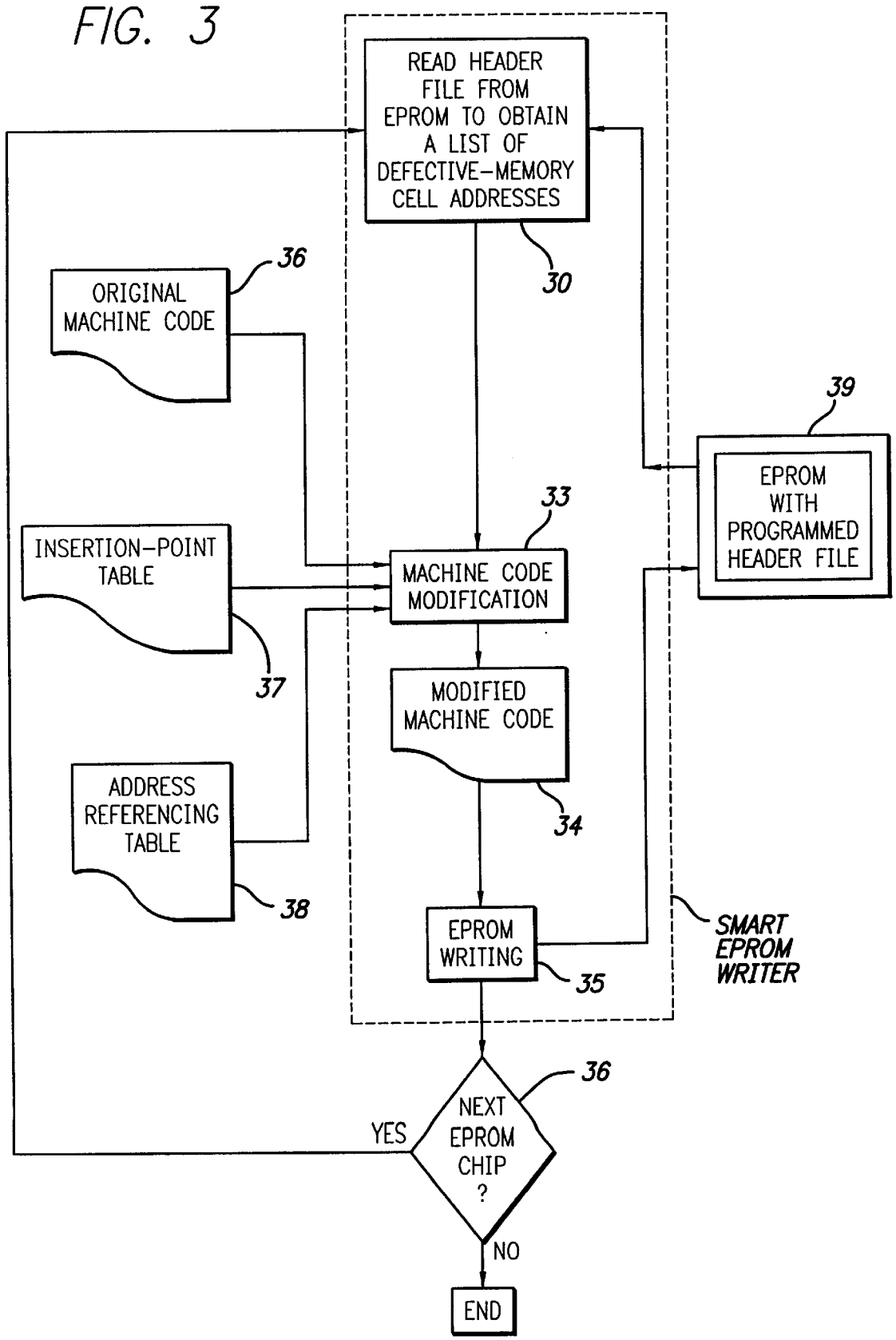
FIG. 3 shows the processes performed by an EPROM writer according to the invention.

For non-volatile memories, such as an EPROM, a microprogram is typically written into the EPROM by a well known EPROM writer. It is known that the information stored in non-volatile memories are retained even when power is OFF. One can use the merit to store the list of defective memory-cell address as the header file at the pre-defined, i.e. the beginning or the ending addresses of the non-volatile memory. An EPROM writer can then obtain the defective memory-cell locations directly by reading the header file information stored in predefined memory addresses of the EPROM. FIGS. 2 and 3 show this approach designed for EPROM.

FIG. 2 shows the processes performed by a memory tester testing a non-volatile memory, e.g. EPROM, and then writing the defective memory-cell address information as a header file into the non-volatile memory. In block 20, memory test by any well known method is performed. If defective memory-cells are found in block 21, in block 22, an address list of the defective memory-cells is obtained. In block 23, the defective memory-cell address information is written as a header file into a pre-defined memory addresses of the tested EPROM, shown in block 29. If no defective memory-cells are found in block 21, a special information is optionally written into the header file to reflect this non-defective situation.

FIG. 3 shows a process performed by an EPROM writer which reads the defective memory-cell locations from the header file of the EPROM memory, modifies the machine code according to the list of defective memory-cell locations contained in the header file, then writes the modified machine code into the EPROM. In block 30, the process reads the header file from the EPROM to obtain the list of defective memory-cell addresses. In block 33, based on the address list from block 30, the original machine code from block 36, the insertion-point table from block 37, and the address referencing table from block 38, the present invention directly modifies the machine code in block 33. The modified machine code obtained, shown in block 34, will functionally bypass defective memory-cell addresses upon program execution. In block 35, the modified machines code are written into the EPROM.

Figure 4:
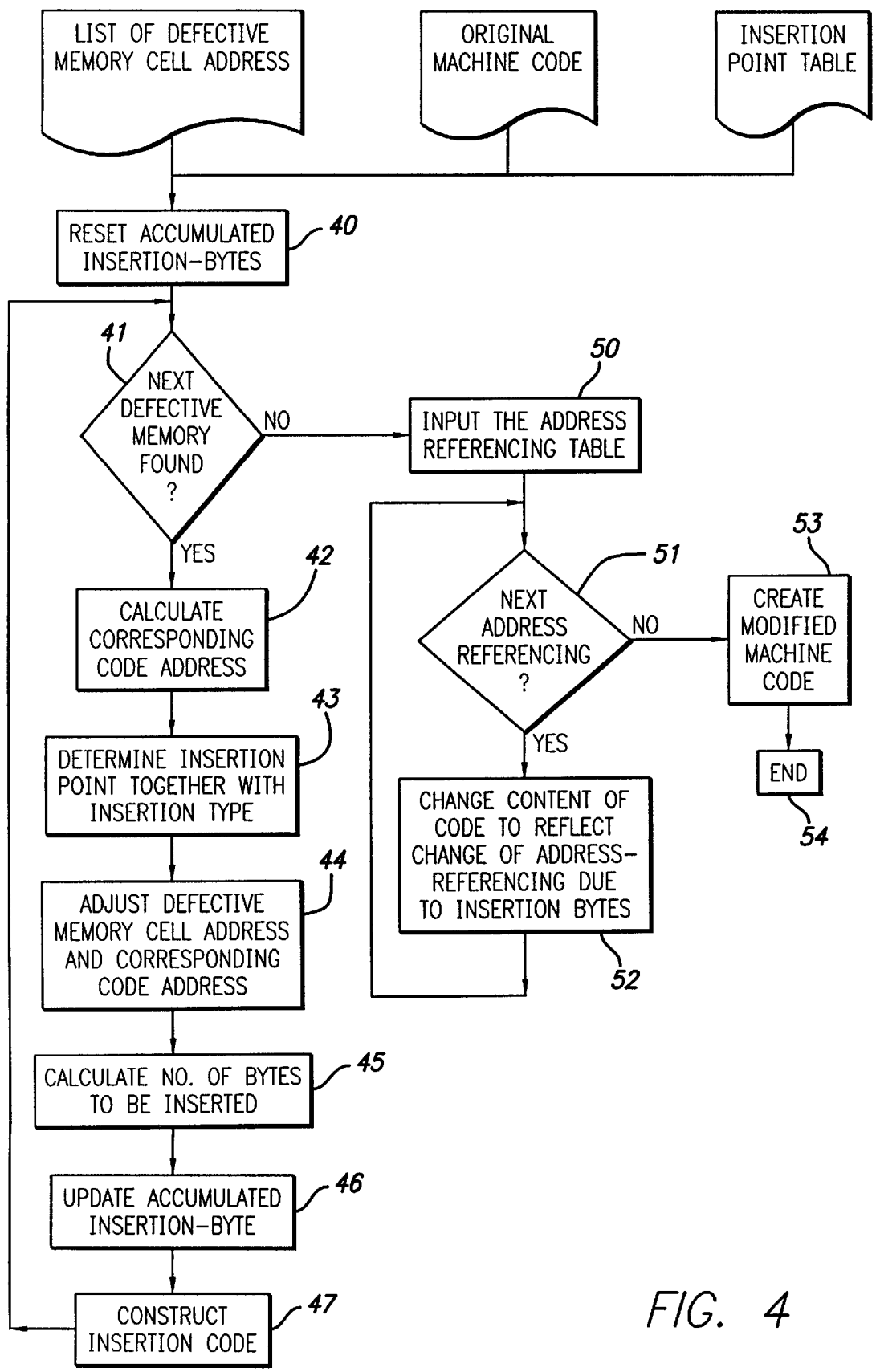
FIG. 4 shows the detailed procedures involved in the modification of machines codes in accordance with the invention.

The details of the procedures involved in the modifications of Machine Codes are disclosed in FIG. 4. Having the list of defective memory-cell address, the original machine code and the insertion point table, the process first in block 40 resets the variable of accumulated-insertion-byte to zero.

In block 41 the process checks if a next defective memory-cell address is found. If no, the process then jumps to block 50.

In block 42 the process subtracts the defective memory-cell address by the value of accumulated-insertion-byte to calculate a corresponding-code-address. The corresponding-code-address is the original memory-cell address at which the machine code stored will fall into this defective memory-cell address considered when the accumulated insertion bytes are effected.

In block 43 the process determines an appropriate insertion point preceding the corresponding-code-address together with the insertion type. If the insertion type for the chosen insertion point is 2, the insertion point needs to be at least two byte addresses lower than the corresponding-code-address. No such restriction is required if the insertion type is 1.

When there are adjacent defective memory-cell addresses, it is of advantage to jump across them altogether by one inserted jump step.

In block 44 the process adjusts the defective memory-cell address and the corresponding-code-address if adjacent defective memory cell addresses exist. The amount of N memory-cells following the defective memory-cell address need to be good memory-cells, where N=1 if insertion type equals 1, and N=2 if the insertion type equals 2. If this is not true, then the process increments the values of defective memory-cell address and the corresponding-code-address respectively by one until this requirement becomes true.

In block 45 the process calculates the number of bytes to be inserted at the insertion point. The number of bytes to be inserted is m≧[corresponding-code-address]−[insertion point address]+1.

In block 46 the process updates the accumulated-insertion-byte by the following equation. Accumulated-insertion-byte←Accumulated-insertion-byte+No of bytes to be inserted in block 45.

In block 47, the insertion code is constructed. If the insertion type equals 1, the insertion code can be any data for filling the bytes to be inserted. In a preferred embodiment, "00" is used. If the insertion type equals 2, then the first instruction of the insertion code is related to the machine code for jumping "m" bytes. Using 8086 code as an example, the first byte would be "EB", the second byte would be kk, where kk=m−2. And since the following bytes will be skipped during program execution, in principle, it can be any data. In a preferred embodiment, the machine code corresponding to NOP is used. For 8086 microprocessors, the machine code corresponding to NOP is "90".

When no more defective memory-cell is found in block 41 during the loops from blocks 41 to 47, in block 50, the process inputs the address referencing table. Afterwards, the process modifies the content of the instruction within the machine code involving the address referencing based on the address-referencing table to take into account of the effect of insertion of additional bytes of machine code mentioned above.

For absolute address referencing, the process increases the content at the machine code address "Addr1" specified in the Address-Referencing Table by x, wherein x is the total number of insertion bytes preceding the absolute code-address referenced. For relative address referencing, the process increases the content at the machine code address "Addr1" specified in the Address-Referencing Table by y, wherein y is the total number of insertion bytes between "Addr1" and "Addr2" in the relative code-address referenced.

In block 51, the process checks if a next address referencing entry is found. If it is, in block 52, the process changes content of code to reflect the influence of insertion bytes over the address-referencing. After completion, the process goes back to block 51. When no more entry is found in block 51, the process goes to block 53. In block 53, based on the information obtained in block 52, the process performs the creation of the modified machine code.

Alternatively, this procedure can be implemented within the block 52. In other words, once the information is obtained in block 52, the process immediately creates the modified code. If this alternative is adopted and no more address referencing is found in block 51, the process directly goes to block 54.

Table 5 shows how the modified machine code is generated based on the list of Defective memory-cell Address of Table 2, the Address-Referencing table of Table 3, the Insertion-Point Table in Table 4 and the original machine code in Table 1. After the Accumulated_insertion_byte is reset to 0 in block 40, the loop from block 41 to block 47 are executed three times. The detailed results of these three passes are described in the followings.

FOR THE FIRST PASS:
11. The next defective memory-cell address=0002.
12. The corresponding-code-address=0002−0=0002.
13. The appropriate insertion point=0001, with insertion type=1.
14. Adjust the defective memory-cell address and the corresponding-code-address by zero.
15. The number of bytes to be inserted is 0002−0001+1=2.
16. The Accumulated_insertion_bytes=0+2=2.
17. The insertion code to be "00" and "00" based on the insertion type of 1.

FOR THE SECOND PASS:
21. The next defective memory-cell address=001D.
22. The corresponding-code-address=001D−2=001B.
23. The appropriate insertion point=0019, with insertion type=2. (Note 001A is also an insertion point, but it is less than 2 byte away from 001B, and therefore can not be used for Type 2 insertion.)
24. Adjust the defective memory-cell address and the corresponding-code-address by zero.
25. The number of bytes to be inserted is 001B−0019+1=3.
26. The Accumulated_insertion_bytes=2+3=5.
27. The insertion code to be "EB" "01" and "90," where the second byte 01 is equal to "m−2"="3−2"="01".

FOR THE THIRD PASS:
31. The next defective memory-cell address=0028.
32. The corresponding-code-address=0028−5=0023.
33. The appropriate insertion point=0020, with insertion type=2.
(Note 0022 is also an insertion point, but it is less than 2 byte away from 0023, and therefore can not be used for Type 2 insertion.)
34. Adjust the defective memory-cell address and the corresponding-code-address respectively by each incrementing 1. This is due to another defective memory-cell at memory address 0029, which is less than two bytes away from the current defective memory-cell address 0028. As a result, the defective memory-cell address is incremented by 1 to 0029, and the corresponding-code-address is also incremented by 1 to 0024.
35. The number of bytes to be inserted is 0024−0020+1=5.
36. The Accumulated_insertion_bytes=5+5=10.
37. The insertion code to be "EB" "03" "90" "90" and "90," where the second byte "03" is equal to "m−2"="5−2"="03".

After the above three passes are executed, there are no defective memory-cell is found any more, and the process goes to the block 50. The following statuses are encountered due to the Address-Referencing table shown in Table 3.

The first one from the Address-Referencing Table is an absolute-address referencing at the machine-code address of 0016, where two bytes are used to represent the absolute machine-code address 0008 referenced. The content of the two bytes at the machine-code addresses 0016 and 0017 are "08" "00" (lower byte first in 8086 machine code) to represent an absolute address 0008. Since the accumulated insertion bytes is 2 prior to the machine-code address, 0008, the content 0008 is increased by 2 to be "0A" "00" representing the new address 000A.

The next one from the Address-Referencing Table a relative-address referencing at the machine-code address of 001F, where one byte is used to represent the relative machine-code address 0024 referenced. The content of the one byte at the machine-code addresses 001F is "04." Since the total insertion bytes is 5 between Addr1 of 001F and Addr2 of 0024, the memory content "04" is increased by 5 to "09" accordingly.

After no more entry is left on the list of the Address-Referencing Table, the process stops.

Table 6 shows the modified machine code based on the procedure outlined in Table 5 and described above. As shown in Table 6, the defective memory-cell addresses 0002, 001D, 0028 and 0029 are all bypassed when the modified machine code is loaded in the memory for execution. The corresponding Assembler code is also listed for reference.

Although the preferred embodiment of the invention are recited using assembly language and machine code of 80×86 microprocessor, it is apparent, the spirit and essence of the invention, which is defined by the following appended claims, is not limit to any specific machine or any specific programming language.

TABLE 1

Assembly Instruction Steps and Corresponding Machine Code

| Assembly Language Instructions | | Machine Code Address | (Original) Machine Code |
|---|---|---|---|
| data_byte | | 0000 | A3 |
| tab1(0) | | 0001 | B1 |
| | | 0002 | B2 |
| tab1(1) | | 0003 | C3 |
| | | 0004 | C4 |
| tab1(2) | | 0005 | D5 |
| | | 0006 | D6 |
| entry1 | | 0007 | E1 |
| entry2 | | 0008 | E2 |
| entry3 | | 0009 | E3 |
| tab2(0) | | 000A | 00 |
| | | 000B | 06 |
| tab2(1) | | 000C | 00 |
| | | 000D | 08 |
| tab2(2) | | 000E | 00 |
| | | 000F | 0B |
| MOV | AX,CS | 0010 | 8C |
| | | 0011 | C8 |
| MOV | ES,AX | 0012 | 8E |
| | | 0013 | C0 |
| CS: | | 0014 | 2E |
| MOV | AL, [0008] | 0015 | A0 |
| | | 0016 | 08 |
| | | 0017 | 00 |
| INC | DX | 0018 | 42 |
| OUT | DX,AL | 0019 | EE |
| MOV | AL,E0 | 001A | B0 |
| | | 001B | E0 |

TABLE 1-continued

Assembly Instruction Steps and Corresponding Machine Code

| Assembly Language Instructions | | Machine Code Address | (Original) Machine Code |
|---|---|---|---|
| CMP | AL,FF | 001C | 3C |
|  |  | 001D | FF |
| JZ | 0024 | 001E | 74 |
|  |  | 001F | 04 |
| MOV | AL,3F | 0020 | B0 |
|  |  | 0021 | 3F |
| MOV | AH,4C | 0022 | B4 |
|  |  | 0023 | 4C |
| OUT | DX,AL | 0024 | EE |

TABLE 2

List of Defective-Memory Cell Address

| Defective-Memory Cell Address |
|---|
| 0002 |
| 001D |
| 0028 |
| 0029 |
| — |
| — |

TABLE 3

Address-Referencing Table

| Machine-Code Address (Addr1) | # of Bytes for Content of Addr1 | Referenced Machine-Code Address (Addr2) | Address Referencing 1 = Absolute 2 = Relative |
|---|---|---|---|
| 0016 | 2 | 0008 | 1 |
| 001F | 1 | 0024 | 2 |
| — | — | — | — |
| — | — | — | — |

TABLE 4

Insertion-Point Table and Original Machine Code

| Machine Code Address | Insertion Point & Type | Original Machine Code |
|---|---|---|
| 0000 | 1 | A3 |
| 0001 | 1 | B1 |
| 0002 |  | B2 |
| 0003 | 1 | C3 |
| 0004 |  | C4 |
| 0005 | 1 | D5 |
| 0006 |  | D6 |
| 0007 | 1 | E1 |
| 0008 | 1 | E2 |
| 0009 | 1 | E3 |
| 000A | 1 | 00 |
| 000B |  | 06 |
| 000C | 1 | 00 |
| 000D |  | 08 |
| 000E | 1 | 00 |

TABLE 4-continued

Insertion-Point Table and Original Machine Code

| Machine Code Address | Insertion Point & Type | Original Machine Code |
|---|---|---|
| 000F |  | 0B |
| 0010 | 2 | 8C |
| 0011 |  | C8 |
| 0012 | 2 | 8E |
| 0013 |  | C0 |
| 0014 | 2 | 2E |
| 0015 | 2 | A0 |
| 0016 |  | 08 |
| 0017 |  | 00 |
| 0018 | 2 | 42 |
| 0019 | 2 | EE |
| 001A | 2 | B0 |
| 001B |  | E0 |
| 001C | 2 | 3C |
| 001D |  | FF |
| 001E | 2 | 74 |
| 001F |  | 04 |
| 0020 | 2 | B0 |
| 0021 |  | 3F |
| 0022 | 2 | B4 |
| 0023 |  | 4C |
| 0024 | 2 | EE |

TABLE 5

Machine-Code Modification

| Machine Code Address | Insertion Point & Type | Original Machine Code | Code Insertion | Code Alterations |
|---|---|---|---|---|
| 0000 | 1 | A3 |  |  |
| 0001 | 1 | B1 | 00 |  |
| 0002 |  | B2 | 00 |  |
| 0003 | 1 | C3 |  |  |
| 0004 |  | C4 |  |  |
| 0005 | 1 | D5 |  |  |
| 0006 |  | D6 |  |  |
| 0007 | 1 | E1 |  |  |
| 0008 | 1 | E2 |  |  |
| 0009 | 1 | E3 |  |  |
| 000A | 1 | 00 |  |  |
| 000B |  | 06 |  |  |
| 000C | 1 | 00 |  |  |
| 000D |  | 08 |  |  |
| 000E | 1 | 00 |  |  |
| 000F |  | 0B |  |  |
| 0010 | 2 | 8C |  |  |
| 0011 |  | C8 |  |  |
| 0012 | 2 | 8E |  |  |
| 0013 |  | C0 |  |  |
| 0014 | 2 | 2E |  |  |
| 0015 | 2 | A0 |  |  |
| 0016 |  | 08 |  | 0A |

TABLE 5-continued

Machine-Code Modification

| | | | | |
|---|---|---|---|---|
| 0017 | | D0 | | |
| 0018 | 2 | 42 | | |
| 0019 | 2 | EE | EB | |
| 001A | 2 | B0 | 01 | |
| 001B | | E0 | 90 | |
| 001C | 2 | 3C | | |
| 001D | | FF | | |
| 001E | 2 | 74 | | |
| 001F | | 04 | | 09 |
| 0020 | 2 | B0 | EB | |
| 0021 | | 3F | 03 | |
| 0022 | 2 | B4 | 90 | |
| 0023 | | 4C | 90 | |
| 0024 | 2 | EE | 90 | |

Note: Defective-memory cell addresses are 0002, 001D, 0028 and 0029. Their corresponding machine code addresses are: 0002, 001D-2 = 001B, 0028-5 = 0023 and 0029-5 = 0024 respectively. The code at code address 0016 is to be changed fro "08" to "0A" to reflect the change of absolute address referencing, while the code at code address 001F is to be changed from "04" to "09" to reflect the change of relative address referencing, due to the number of bytes to be inserted in the original machine code.

TABLE 6

Modified Machine Code to Bypass Defective Memory-Cell Address

| Original Machine Code | Modified Machine Code | Memory Address < >: defective | Corresponding Assembler Code |
|---|---|---|---|
| A3 | A3 | 0000 | data_byte |
| B1 | 0 | 0001 | dummy_byte1 |
| B2 | 0 | <0002> | dummy_byte2 |
| C3 | B1 | 0003 | tab1(0) |
| C4 | B2 | 0004 | |
| D5 | C3 | 0005 | tab1(1) |
| D6 | C4 | 0006 | |
| E1 | D5 | 0007 | tab1(2) |
| E2 | D6 | 0008 | |
| E3 | E1 | 0009 | entry1 |
| 00 | E2 | 000A | entry2 |
| 06 | E3 | 000B | entry3 |
| 00 | 00 | 000C | tab2(0) |
| 06 | 06 | 000D | |
| 00 | 00 | 000E | tab2(1) |
| 0B | 08 | 000F | |
| 8C | 00 | 0010 | tab2(2) |
| C8 | 0B | 0011 | |
| 8E | 8C | 0012 | MOV AX,CS |

TABLE 6-continued

Modified Machine Code to Bypass Defective Memory-Cell Address

| | | | | |
|---|---|---|---|---|
| C0 | C8 | 0013 | | |
| 2E | 8E | 0014 | MOV | AX,CS |
| A0 | C0 | 0015 | | |
| 0A | 2E | 0016 | CS: | |
| 00 | A0 | 0017 | MOV | AL,[000A] |
| 42 | 0A | 0018 | | |
| EE | 00 | 0019 | | |
| B0 | 42 | 001A | INC | DX |
| E0 | EB | 001B | JMP | $+3 |
| 3C | 01 | 001C | | |
| FF | 90 | <001D> | NOP | |
| 74 | EE | 001E | OUT | DX,AL |
| 04 | B0 | 001F | MOV | AL,E0 |
| B0 | E0 | 0020 | | |
| 3F | 3C | 0021 | CMP | AL,FF |
| B4 | FF | 0022 | | |
| 4C | 74 | 0023 | JZ | 002E |
| EE | 09 | 0024 | | |
| --- | EB | 0025 | JMP | $+5 |
| --- | 03 | 0026 | | |
| --- | 90 | 0027 | NOP | |
| --- | 90 | <0028> | NOP | |
| --- | 90 | <0029> | NOP | |
| --- | B0 | 002A | MOV | AL,3F |
| --- | 3F | 002B | | |
| --- | B4 | 002C | MOV | AH,4C |
| --- | 4C | 002D | | |
| --- | EE | 002E | OUT | DX,AL |

What is claimed is:

1. A method for modifying a machine code, which performs a predetermined function after being loaded in a memory device for program execution, the machine code including an address-referencing instruction step, the address-referencing instruction step including an address-referencing value, the memory device having good memory locations and at least one defective memory-cell location, said method comprising the steps of:

(1) inputting a defective memory-cell location and a list of insertion-point, wherein an insertion point is a code address at which an extra code step may be inserted without changing the predetermined function of the machine code;

(2) inserting the extra code step at one of the insertion-point such that a modified machine code is obtained, wherein the modified machine code, when loaded in the memory device, substantially performs the same function as the predetermined function while bypassing the defective memory-cell locations during program execution;

(3) modifying the address-referencing value to take into account of the required change of the address-referencing instruction step due to the insertion of the extra code step in the machine code.

2. The method of claim 1, wherein the list of insertion-point includes a plurality of entries, each entry includes one code address and one corresponding insertion_type_value representative of an insertion_type, the insertion_type_value takes either a first value or a second value, wherein the first value specifies said code address as being at the beginning of a data or stack declaration in the machine code, the second value specifies said code address as being at the beginning of an instruction step in the machine code, and wherein the extra code step inserted includes a jump step if the insertion_type_value takes the second value, wherein said inserted jump step functionally jumps to a good memory location when said modified machine code being loaded in the memory for program execution.

3. The method of claim 1, wherein the extra code step inserted is obtained by steps comprising:
   (1) based on the defective memory-cell address, calculating a corresponding-code-address, wherein the corresponding-code-address is a code address which corresponds to an instruction step in the machine code, when loaded into the memory, falling into said defective memory-cell address;
   (2) based on the corresponding-code-address, selecting an insertion point together with an insertion type;
   (3) calculating the number of bytes (m) to be inserted by equation of m≧[corresponding-code-address]−[insertion point address]+1;
   (4) constructing the extra code step which consists of m bytes of code.

4. The method of claim 1, wherein the extra code step inserted includes at least a jump step which functionally jumps to a good memory location.

5. The method of claim 1, further comprising step of:
   inputting an address referencing table, wherein the address referencing table includes a plurality of entries, each entry includes a code address, number of bytes, a referenced code address and an address_referencing_type, the address_referencing_type takes either a first value or a second value, the first value being representative of an absolute address referencing and the second value being representative of a relative address referencing.

6. The method of claim 5, wherein, as the address_referencing_type has the first value, the address-referencing value of the address-referencing instruction is modified according to the accumulated insertion bytes preceding the referenced code address, and as the address_referencing_type has the second value, the address-referencing value of the address-referencing instruction is modified according to the accumulated insertion bytes between the code address and the referenced code address.

7. The method of claim 1, wherein the memory device is built in an IC chip.

8. The method of claim 1, wherein the memory device is a memory chip.

9. The method of claim 1, wherein the memory device is a non-volatile memory.

10. The method of claim 9, wherein the information of the defective memory-cell location is stored in a header file of the non-volatile memory.

11. The method of claim 3, wherein, the corresponding-code-address is obtained based on the extra machine code step preceding the defective memory-cell address being inserted.

12. The method of claim 3, wherein, between step (2) and (3), including the step of:
   incrementing the defective memory-cell address and the corresponding-code-address until a predetermined number of N memory-cells following the defective memory-cell address are good memory-cells.

13. The method of claim 12, where N=1 if insertion_type_value equals to the first value, and N=2 if the insertion_type_value equals to the second value.

14. A memory testing/programming system comprising:
   a tester for testing a memory device having good memory locations, the tester outputting a defective memory-cell location when defective memory cell is found;
   a program loader for loading a machine code, which performs a predetermined function, in said memory device, by performing the steps of:
      (1) modifying the machine code by inserting an extra code step according to the defective memory-cell location such that a modified machine code is obtained, the machine code including an address-referencing instruction step, the address-referencing instruction step including an address-referencing value;
      (2) modifying the address-referencing value to take into account the required change of the address-referencing instruction step due to the insertion of the extra code step in the machine code;
      (3) loading the modified machine code into the memory device whereby the modified machine code substantially performs the same function as the predetermined function while functionally bypassing the defective memory-cell locations during program execution.

15. The memory testing/programming system of claim 14, wherein the memory device is built in an IC chip.

16. The memory testing/programming system of claim 14, wherein the memory device is a memory chip.

17. The memory testing/programming system of claim 14, wherein the memory device is a non-volatile memory.

18. The memory testing/programming system of claim 17, wherein the information of the defective memory-cell location is stored in a header file of the non-volatile memory.

19. The memory testing/programming system of claim 14, wherein the extra code step inserted is obtained by steps comprising:
   (1) based on the defective memory-cell address, calculating a corresponding-code-address, wherein the corresponding-code-address is a code address which corresponds to an instruction step in the machine code, when loaded into the memory, falling into said defective memory-cell address;
   (2) based on the corresponding-code-address, selecting an insertion point together with an insertion type;
   (3) calculating the number of bytes (m) to be inserted by equation of m≧[corresponding-code-address]−[insertion point address]+1;
   (4) constructing the extra code step which consists of m bytes of code.

20. A memory programmer system for writing machine code into a memory device having good memory locations and any number of defection memory locations, the machine code performing a predetermined function while being executed, the machine code including an address-referencing instruction step, the address-referencing instruction step including an address-referencing value, comprising:
   means for modifying the machine code by inserting an extra code step to obtain a modified machine code;
   means for modifying the address-referencing value to take into account the required change of the address-referencing instruction step due to the insertion of the extra code step in the machine code;
   means for writing the modified machine code into the memory device, whereby the modified machine code substantially performs the same function as the predetermined function while bypassing the defective memory locations during program execution.

21. The memory programmer system of claim 20, wherein the defective memory location is obtained by a tester built within the memory programmer system.

22. The memory programmer system of claim 20, wherein the defective memory location is obtained by a tester external to the memory programmer system.

23. The memory programmer system of claim 20, wherein the memory device is built in an IC chip.

24. The memory programmer system of claim 20, wherein the memory device is a memory chip.

25. The memory programmer system of claim 20, wherein the memory device is a non-volatile memory.

26. The memory programmer system of claim 25, wherein the information of the defective memory location is stored in a header file of the non-volatile memory.

27. The memory programmer system of claim 20, wherein the extra code step inserted is obtained by steps comprising:
(1) based on the defective memory-cell address, calculating a corresponding-code-address, wherein the corresponding-code-address is a code address which corresponds to an instruction step in the machine code, when loaded into the memory, falling into said defective memory-cell address;
(2) based on the corresponding-code-address, selecting an insertion point together with an insertion type;
(3) calculating the number of bytes (m) to be inserted by equation of $m \geq [\text{corresponding-code-address}] - [\text{insertion point address}] + 1$;
(4) constructing the extra code step which consists of m bytes of code.

28. A programming system for a non-volatile memory chip having good memory locations, comprising:
a tester for testing the memory chip, the tester outputting defective memory-cell locations into a header file within the non-volatile memory chip when defective memory cell is found;
a programmer means for modifying an original machine code based on the defective memory-cell locations and a list of insertion-point, by inserting an extra code step to obtain a modified machine code, the original machine code including an address-referencing instruction step, the address-referencing instruction step including an operation code and an operand address, the operand address including an address-referencing value, the programmer means further modifying the address-referencing value to take into account the required change of the address-referencing instruction step due to the insertion of the extra code step in the original machine code and writing the modified machine code into the non-volatile memory chip.

29. The programming system of claim 28, wherein the non-volatile memory chip is an EPROM.

30. The programming system of claim 28, wherein the extra code step inserted is obtained by steps comprising:
(1) based on the defective memory-cell address, calculating a corresponding-code-address, wherein the corresponding-code-address is a code address which corresponds to an instruction step in the machine code, when loaded into the memory, falling into said defective memory-cell address;
(2) based on the corresponding-code-address, selecting an insertion point together with an insertion type;
(3) calculating the number of bytes (m) to be inserted by equation of $m \geq [\text{corresponding-code-address}] - [\text{insertion point address}] + 1$;
(4) constructing the extra code step which consists of m bytes of code.

* * * * *